United States Patent
Imai et al.

(10) Patent No.: US 12,464,903 B2
(45) Date of Patent: Nov. 4, 2025

(54) DISPLAY DEVICE

(71) Applicant: Magnolia White Corporation, Tokyo (JP)

(72) Inventors: Nobuo Imai, Tokyo (JP); Hiroshi Ogawa, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 280 days.

(21) Appl. No.: 18/329,594

(22) Filed: Jun. 6, 2023

(65) Prior Publication Data

US 2023/0403886 A1 Dec. 14, 2023

(30) Foreign Application Priority Data

Jun. 10, 2022 (JP) .................. 2022-094446

(51) Int. Cl.
  *H10K 59/122* (2023.01)
  *H10K 59/12* (2023.01)
  *H10K 59/35* (2023.01)

(52) U.S. Cl.
  CPC ........ *H10K 59/122* (2023.02); *H10K 59/1201* (2023.02); *H10K 59/352* (2023.02)

(58) Field of Classification Search
  CPC . H10K 59/122; H10K 59/1201; H10K 59/352
  See application file for complete search history.

(56) References Cited

U.S. PATENT DOCUMENTS

| | | | |
|---|---|---|---|
| 11,527,732 B1* | 12/2022 | Chen | H10K 59/80517 |
| 11,610,954 B1* | 3/2023 | Lin | H10K 59/122 |
| 11,882,709 B2* | 1/2024 | Lee | H10K 59/122 |
| 2004/0160170 A1 | 8/2004 | Sato et al. | |
| 2009/0009069 A1 | 1/2009 | Takata | |
| 2019/0363275 A1 | 11/2019 | Ochi et al. | |
| 2022/0077251 A1 | 3/2022 | Choung et al. | |

FOREIGN PATENT DOCUMENTS

| | | |
|---|---|---|
| JP | 2000-195677 A | 7/2000 |
| JP | 2004-207217 A | 7/2004 |
| JP | 2007-073284 A | 3/2007 |
| JP | 2007-081271 A | 3/2007 |
| JP | 2007-103032 A | 4/2007 |
| JP | 2007-227289 A | 9/2007 |
| JP | 2008-135325 A | 6/2008 |
| JP | 2009-32673 A | 2/2009 |
| JP | 2010-118191 A | 5/2010 |
| WO | 2018/179308 A1 | 10/2018 |

* cited by examiner

*Primary Examiner* — Anne M Hines
(74) *Attorney, Agent, or Firm* — XSENSUS LLP

(57) ABSTRACT

According to one embodiment, a display device includes a lower electrode, a rib formed of an inorganic insulating material and including an aperture overlapping the lower electrode, a partition including a lower portion and an upper portion, an organic layer provided on the lower electrode in the aperture, an upper electrode provided on the organic layer, a cap layer provided on the upper electrode, and a sealing layer. An edge of the aperture includes a first linear portion, a second linear portion and a curved portion connected to the first linear portion and the second linear portion. An angle between the first linear portion and the second linear portion is greater than or equal to 90°.

10 Claims, 14 Drawing Sheets

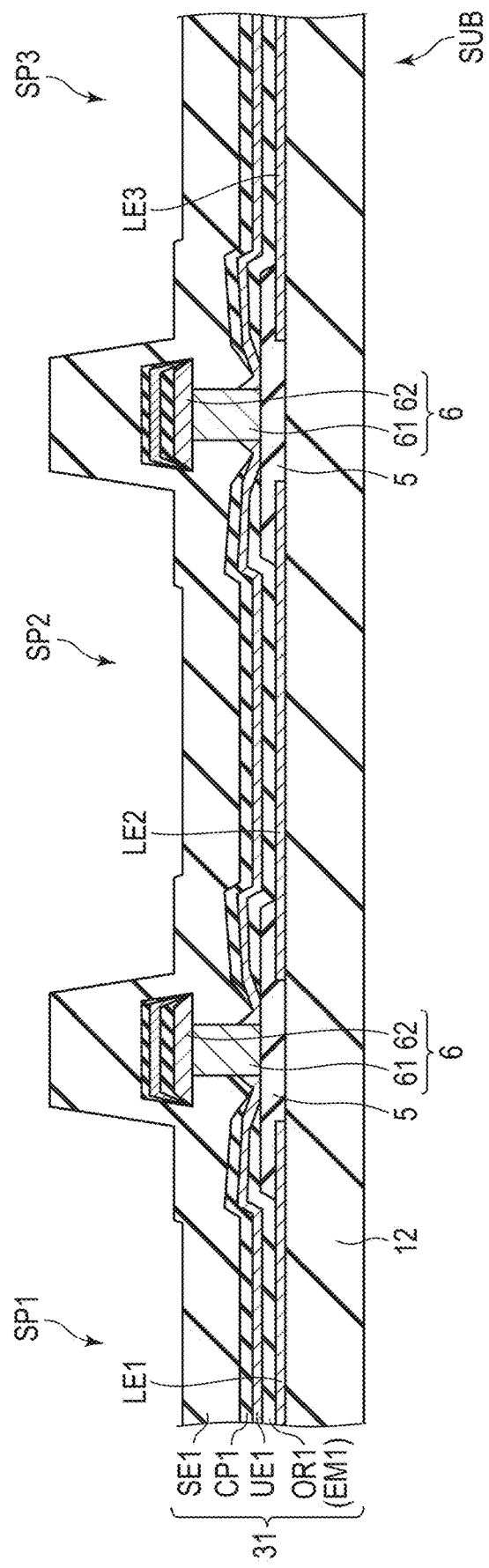
F I G. 9

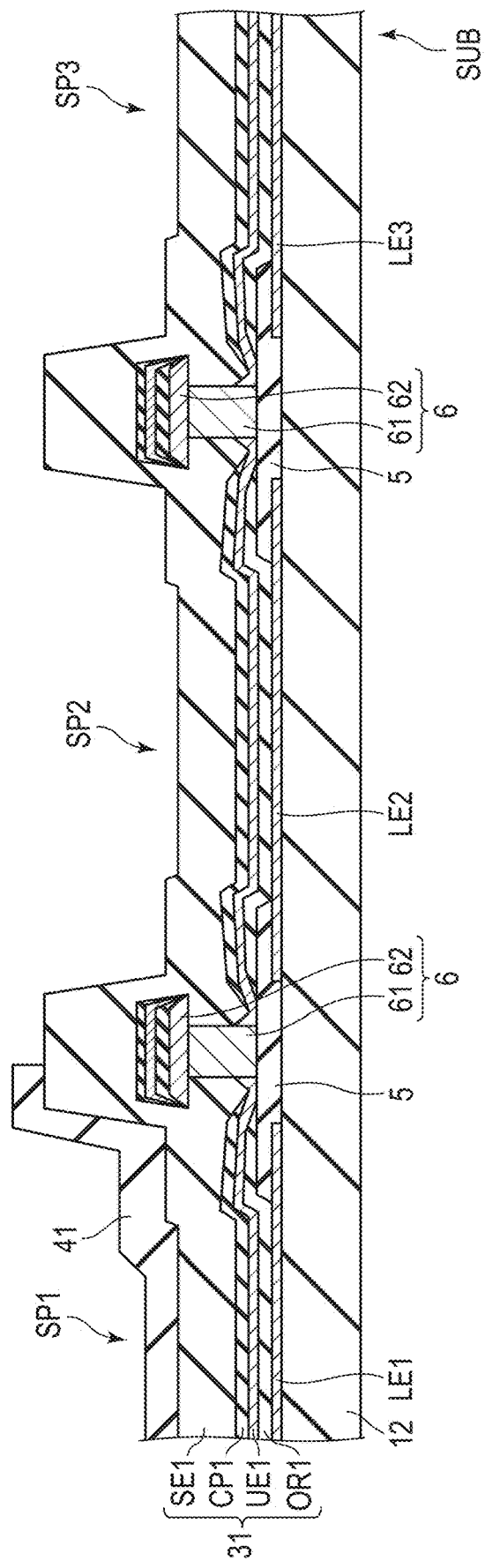
F I G. 10

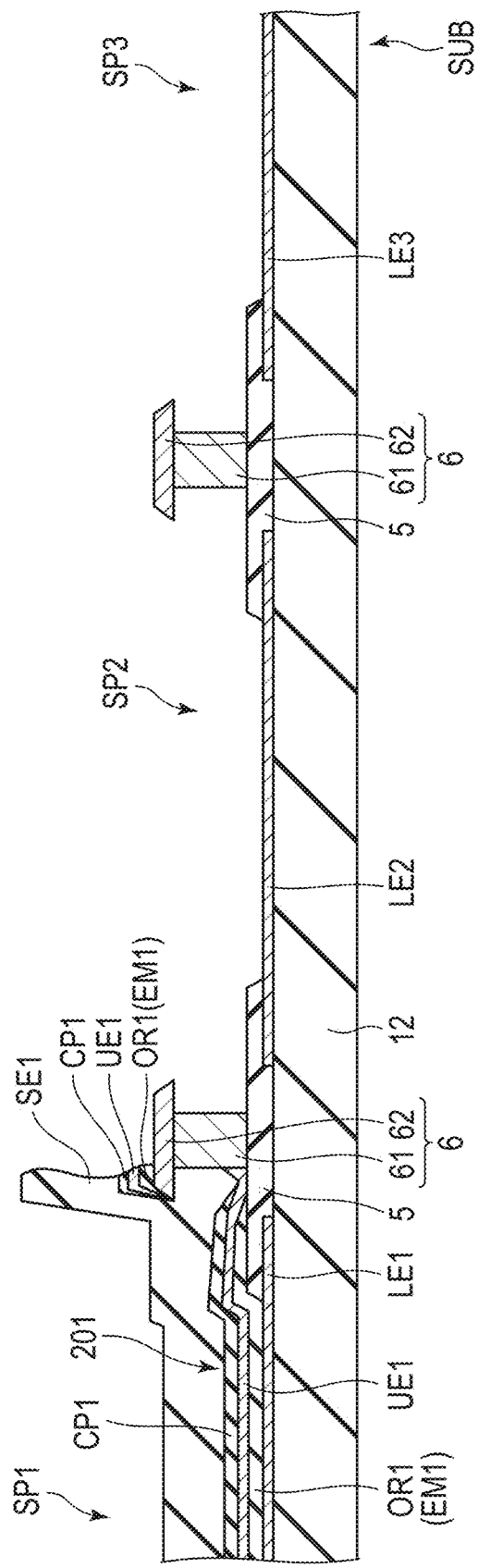
F I G. 12

DISPLAY DEVICE

CROSS-REFERENCE TO RELATED APPLICATIONS

This application is based upon and claims the benefit of priority from Japanese Patent Application No. 2022-094446, filed Jun. 10, 2022, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability has been required.

BRIEF DESCRIPTION OF THE DRAWINGS

FIG. 9 is a diagram for explaining the manufacturing method of the display device DSP.

FIG. 10 is a diagram for explaining the manufacturing method of the display device DSP.

FIG. 12 is a diagram for explaining the manufacturing method of the display device DSP.

DETAILED DESCRIPTION

Figure 1:
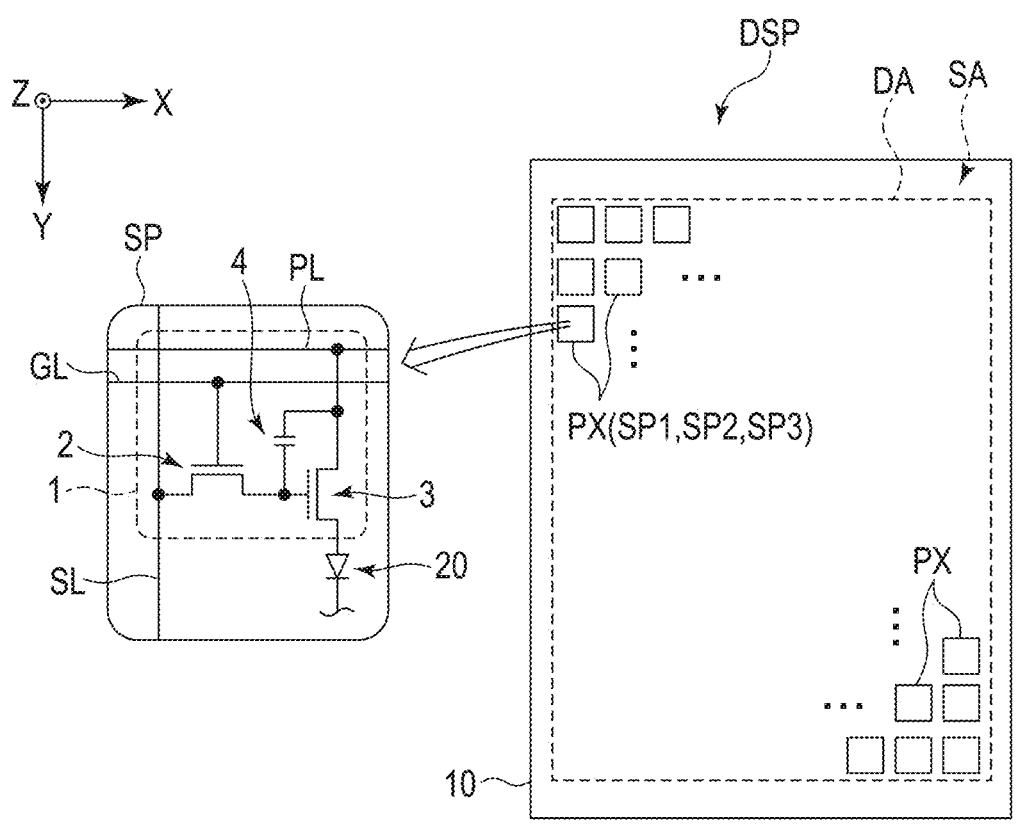
FIG. 1 is a diagram showing a configuration example of a display device DSP.

Embodiments described herein aim to provide a display device which can prevent the reduction in reliability.

In general, according to one embodiment, a display device comprises a substrate, a lower electrode provided above the substrate, a rib formed of an inorganic insulating material and comprising an aperture overlapping the lower electrode, a partition comprising a lower portion provided on the rib and formed of a conductive material, and an upper portion provided on the lower portion and protruding from a side surface of the lower portion, an organic layer provided on the lower electrode in the aperture, an upper electrode provided on the organic layer, a cap layer provided on the upper electrode, and a sealing layer which covers the cap layer and is in contact with the lower portion of the partition. An edge of the aperture includes a first linear portion, a second linear portion and a curved portion connected to the first linear portion and the second linear portion. An angle between the first linear portion and the second linear portion is greater than or equal to 90°.

The embodiments can provide a display device which can prevent the reduction in reliability.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various elements are viewed parallel to the third direction Z, the appearance is defined as a plan view.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

Figure 2:
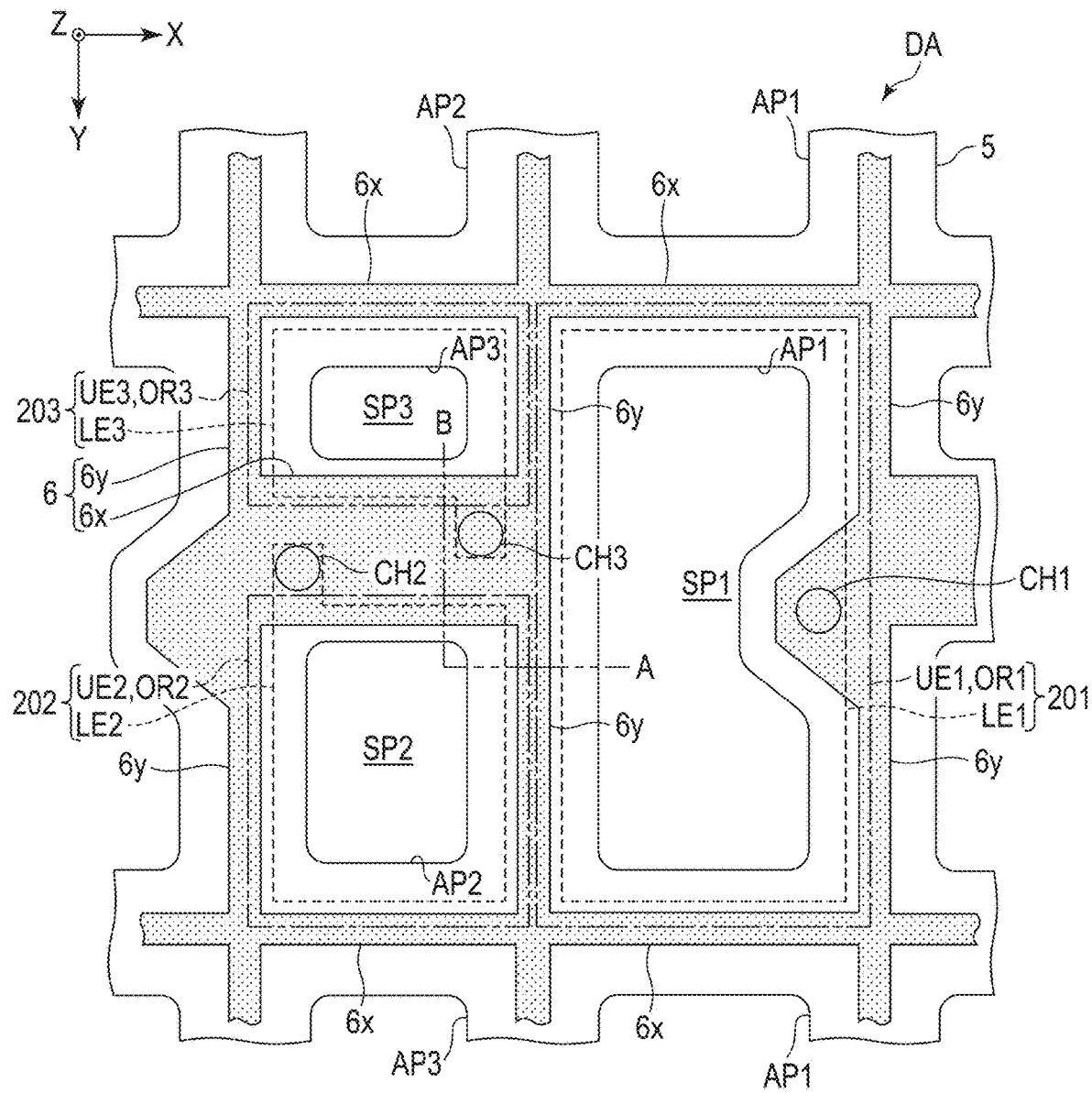
FIG. 2 is a diagram showing an example of the layout of subpixels SP1, SP2 and SP3.

FIG. 2 is a diagram showing an example of the layout of subpixels SP1, SP2 and SP3.

In the example of FIG. 2, subpixels SP2 and SP3 are arranged in the second direction Y. Further, each of subpixels SP2 and SP3 is adjacent to subpixel SP1 in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively. The shape of each of the apertures AP1, AP2 and AP3 is described later.

The partition 6 overlaps the rib 5 as seen in plan view. The partition 6 comprises a plurality of first partitions 6x extending in the first direction X and a plurality of second partitions 6y extending in the second direction Y. The first partitions 6x are provided between the apertures AP2 and AP3 which are adjacent to each other in the second direction Y and between two apertures AP1 which are adjacent to each other in the second direction Y. Each second partition 6y is provided between the apertures AP1 and AP2 which are adjacent to each other in the first direction X and between the apertures AP1 and AP3 which are adjacent to each other in the first direction X.

In the example of FIG. 2, the first partitions 6x and the second partitions 6y are connected to each other. Thus, the partition 6 is formed into a grating shape surrounding the apertures AP1, AP2 and AP3 as a whole. In other words, the partition 6 comprises apertures in subpixels SP1, SP2 and SP3 in a manner similar to that of the rib 5.

Subpixels SP1, SP2 and SP3 comprise display elements 201, 202 and 203, respectively, as the display elements 20.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. The peripheral portion of each of the lower electrodes LE1, LE2 and LE3 overlaps the rib 5. It should be noted that the outer shape of each of the lower electrodes, organic layers and upper electrodes shown in the figure does not necessarily reflect the accurate shape.

The lower electrode LE1, the upper electrode UE1 and the organic layer OR1 constitute the display element 201 of subpixel SP1. The lower electrode LE2, the upper electrode UE2 and the organic layer OR2 constitute the display element 202 of subpixel SP2. The lower electrode LE3, the upper electrode UE3 and the organic layer OR3 constitute the display element 203 of subpixel SP3.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

For example, the display element 201 of subpixel SP1 is configured to emit light in a blue wavelength range. The display element 202 of subpixel SP2 is configured to emit light in a green wavelength range. The display element 203 of subpixel SP3 is configured to emit light in a red wavelength range.

Figure 3:
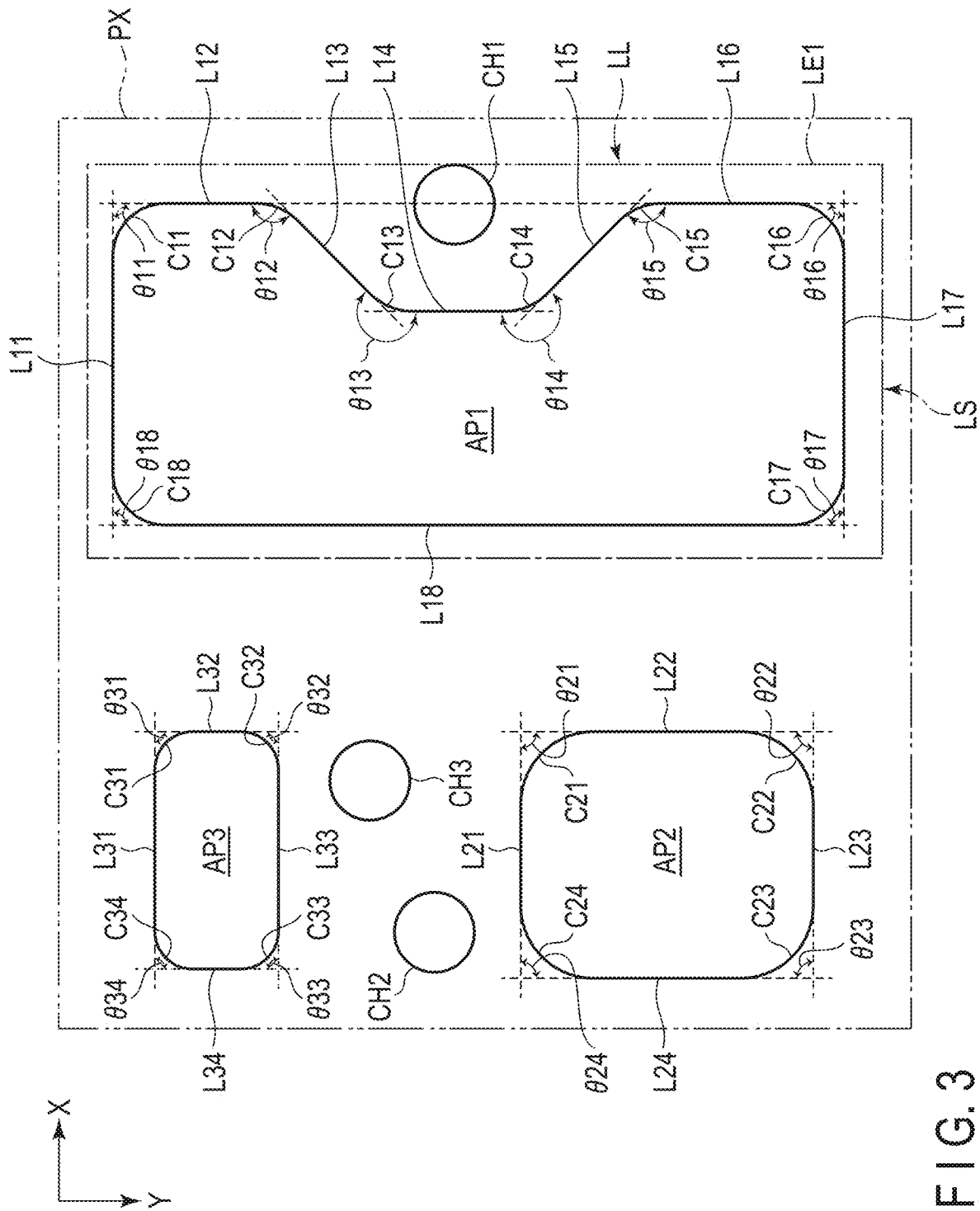
FIG. 3 is a plan view for explaining an example of the shape of each of the apertures AP1, AP2 and AP3 of the rib 5 shown in FIG. 2.

FIG. 3 is a plan view for explaining an example of the shape of each of the apertures AP1, AP2 and AP3 of the rib 5 shown in FIG. 2.

First, the aperture AP1 is explained.

The edge of the aperture AP1 comprises linear portions L11 to L18 and curved portions C11 to C18.

The linear portions L11 and L17 are parallel to each other, extend in the first direction X and are substantially parallel to the short side LS of the lower electrode LE1. The linear portions L12, L14, L16 and L18 are parallel to each other, extend in the second direction Y and are substantially parallel to the long side LL of the lower electrode LE1. In particular, the linear portions L12 and L16 are located on the same straight line. The contact hole CH1 is located between the linear portion L12 and the linear portion L16, and is located on the same straight line as the linear portions L12 and L16. The linear portion L14 is located between the contact hole CH1 and the linear portion L18 in the first direction X. The linear portions L13 and L15 extend in oblique directions different from the first direction X and the second direction Y.

Each of the curved portions C11 to C18 is formed in substantially an arcuate shape. The curved portion C11 is connected to the linear portions L11 and L12. The curved portion C12 is connected to the linear portions L12 and L13. The curved portion C13 is connected to the linear portions L13 and L14. The curved portion C14 is connected to the linear portions L14 and L15. The curved portion C15 is connected to the linear portions L15 and L16. The curved portion C16 is connected to the linear portions L16 and L17. The curved portion C17 is connected to the linear portions L17 and L18. The curved portion C18 is connected to the linear portions L18 and L11.

The angle between two linear portions which are adjacent to each other across an intervening curved portion is greater than or equal to 90°. Here, the angle corresponds to, when the extension of each linear portion is shown by a dotted line in the figure, the angle between the extensions which intersect each other.

For example, angle $\theta 11$ between the linear portion L11 and the linear portion L12 is 90°. All of angle $\theta 12$ between the linear portion L12 and the linear portion L13, angle $\theta 13$ between the linear portion L13 and the linear portion L14, angle $\theta 14$ between the linear portion L14 and the linear portion L15 and angle $\theta 15$ between the linear portion L15 and the linear portion L16 are obtuse angles greater than 90°. All of angle $\theta 16$ between the linear portion L16 and the linear portion L17, angle $\theta 17$ between the linear portion L17 and the linear portion L18 and angle $\theta 18$ between the linear portion L18 and the linear portion L11 are 90°.

Next, the aperture AP2 is explained.

The edge of the aperture AP2 comprises linear portions L21 to L24 and curved portions C21 to C24.

The linear portions L21 and L23 are parallel to each other and extend in the first direction X. The linear portions L22 and L24 are parallel to each other and extend in the second direction Y.

Each of the curved portions C21 to C24 is formed in substantially an arcuate shape. The curved portion C21 is connected to the linear portions L21 and L22. The curved portion C22 is connected to the linear portions L22 and L23. The curved portion C23 is connected to the linear portions L23 and L24. The curved portion C24 is connected to the linear portions L24 and L21.

All of angle $\theta 21$ between the linear portion L21 and the linear portion L22, angle $\theta 22$ between the linear portion L22 and the linear portion L23, angle $\theta 23$ between the linear portion L23 and the linear portion L24 and angle $\theta 24$ between the linear portion L24 and the linear portion L21 are 90°.

Next, the aperture AP3 is explained.

The edge of the aperture AP3 comprises linear portions L31 to L34 and curved portions C31 to C34.

The linear portions L31 and L33 are parallel to each other and extend in the first direction X. The linear portions L32 and L34 are parallel to each other and extend in the second direction Y.

Each of the curved portions C31 to C34 is formed in substantially an arcuate shape. The curved portion C31 is connected to the linear portions L31 and L32. The curved portion C32 is connected to the linear portions L32 and L33. The curved portion C33 is connected to the linear portions L33 and L34. The curved portion C34 is connected to the linear portions L34 and L31.

All of angle $\theta 31$ between the linear portion L31 and the linear portion L32, angle $\theta 32$ between the linear portion L32 and the linear portion L33, angle $\theta 33$ between the linear portion L33 and the linear portion L34 and angle $\theta 34$ between the linear portion L34 and the linear portion L31 are 90°.

The shape of the aperture AP1, AP2 or AP3 is not limited to the example shown in the figure. For example, the edge of each of the apertures AP2 and AP3 may include more linear portions and curved portions than the example shown in the figure.

Figure 4:
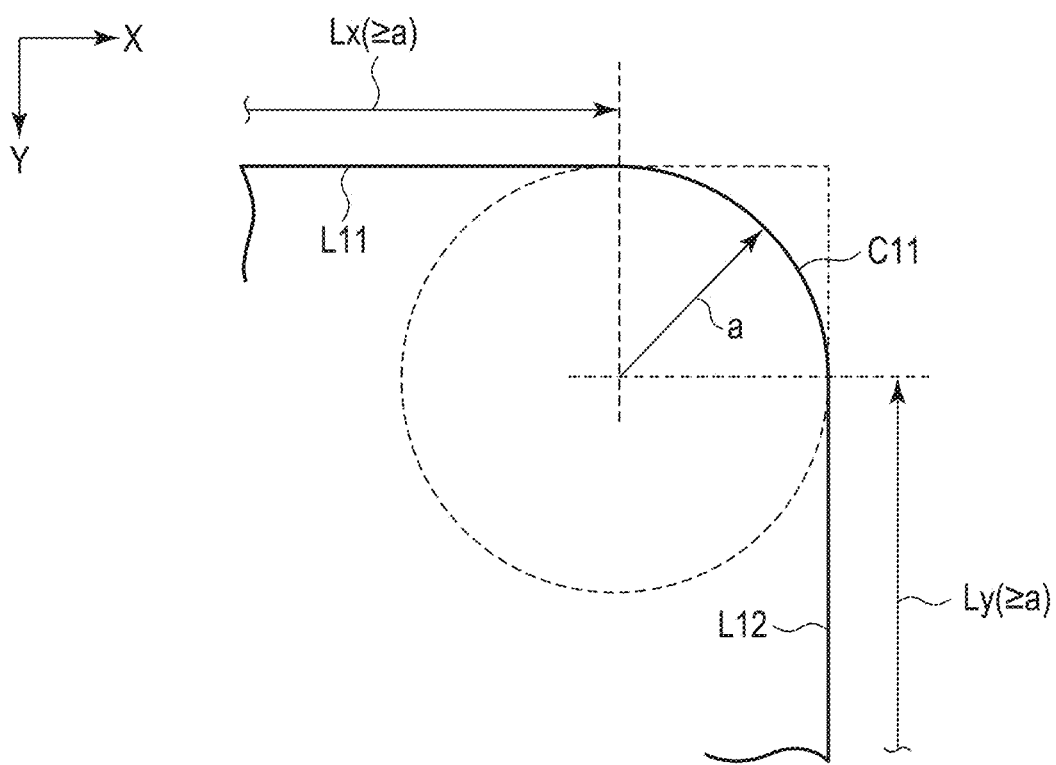
FIG. 4 is a plan view for explaining the desirable lengths of the linear portions included in the edge of the aperture shown in FIG. 3.

FIG. 4 is a plan view for explaining the desirable lengths of the linear portions included in the edge of the aperture shown in FIG. 3.

FIG. 4 shows part of each of the linear portions L11 and L12 and the curved portion C11 in the edge of the aperture AP1.

The curved portion C11 is formed in an arcuate shape as described above and corresponds to part of the circumference of the circle having radius a. The radius of curvature of the curved portion C11 is shown as "a".

The length Lx of the linear portion L11 in the first direction X should be preferably greater than or equal to the radius of curvature a of the curved portion C11 adjacent to the linear portion L11. Similarly, the length Ly of the linear portion L12 in the second direction Y should be preferably greater than or equal to the radius of curvature a of the curved portion C11 adjacent to the linear portion L12. The lengths of the other linear portions included in the aperture AP1 should be also preferably greater than or equal to the radii of curvature of the curved portions adjacent to the linear portions, respectively.

Further, the lengths of the linear portions included in the other apertures AP2 and AP3 should be also preferably greater than or equal to the radii of curvature of the curved portions adjacent to the linear portions, respectively.

Figure 5:
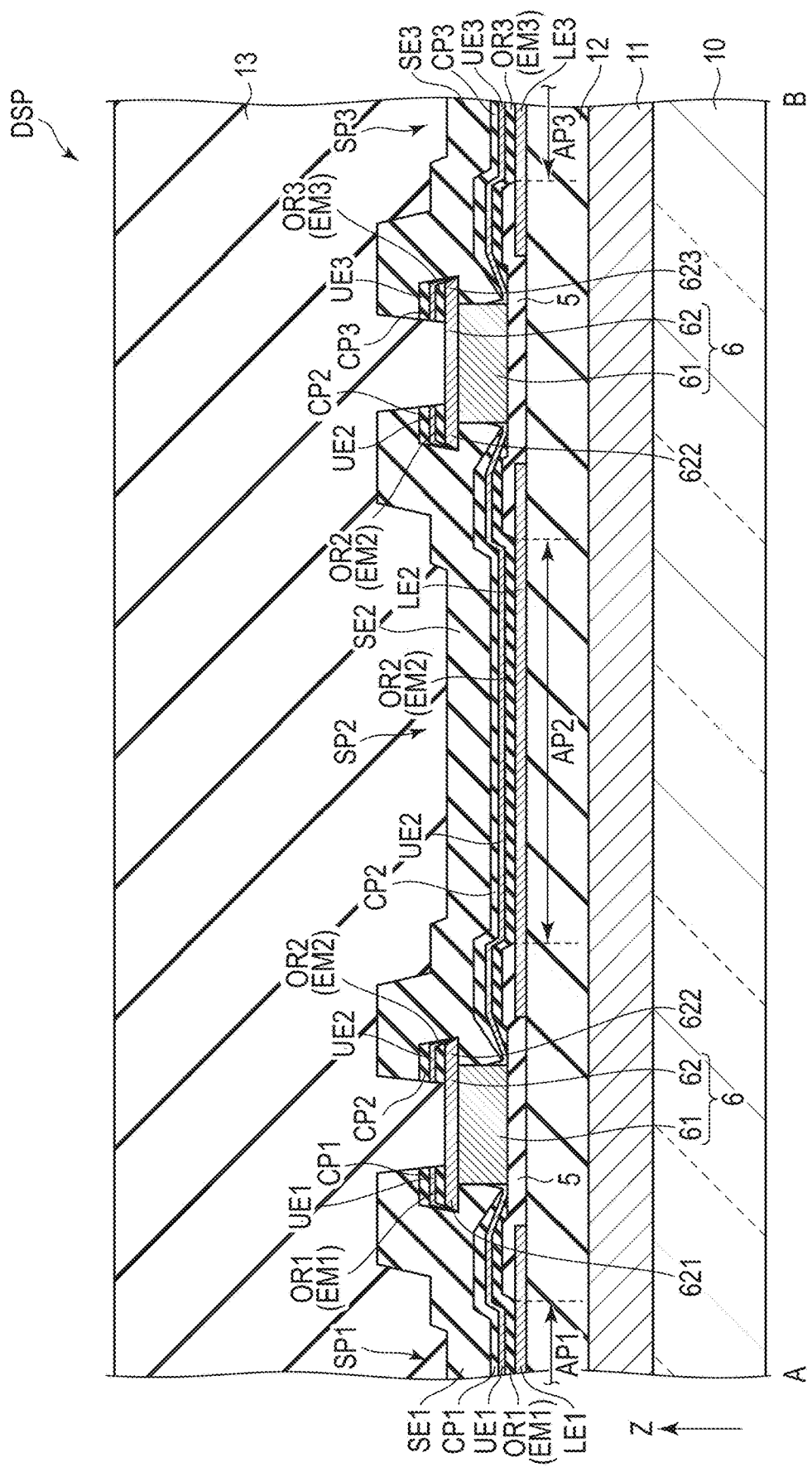
FIG. 5 is a schematic cross-sectional view of the display device DSP along the A-B line of FIG. 2.

FIG. 5 is a schematic cross-sectional view of the display device DSP along the A-B line of FIG. 2.

A circuit layer 11 is provided on the substrate 10 described above. The circuit layer 11 includes various circuits such as the pixel circuit 1, and various lines such as scanning line GL, signal line SL and power line PL shown in FIG. 1. The circuit layer 11 is covered with an insulating layer 12. The insulating layer 12 functions as a planarization film which planarizes the irregularities formed by the circuit layer 11.

The lower electrodes LE1, LE2 and LE3 are provided on the insulating layer 12. The rib 5 is provided on the insulating layer 12 and the lower electrodes LE1, LE2 and LE3. The end portions of the lower electrodes LE1, LE2 and LE3 are covered with the rib 5. In other words, the end portions of the lower electrodes LE1, LE2 and LE3 are provided between the insulating layer 12 and the rib 5. Of the lower electrodes LE1, LE2 and LE3, between the lower electrodes which are adjacent to each other, the insulating layer 12 is covered with the rib 5.

The partition 6 includes a lower portion (stem) 61 provided on the rib 5 and an upper portion (shade) 62 provided on the lower portion 61. The lower portion 61 of the partition 6 shown on the left side of the figure is located between the aperture AP1 and the aperture AP2. The lower portion 61 of the partition 6 shown on the right side of the figure is located between the aperture AP2 and the aperture AP3. The upper portion 62 has a width greater than that of the lower portion 61. By this configuration, the both end portions of the upper portion 62 protrude relative to the side surfaces of the lower portion 61. This shape of the partition 6 may be called an overhang shape. Of the upper portion 62, a portion which protrudes to the aperture AP1 relative to the lower portion 61 is referred to as a protrusion 621. A portion which protrudes to the aperture AP2 relative to the lower portion 61 is referred to as a protrusion 622. A portion which protrudes to the aperture AP3 relative to the lower portion 61 is referred to as a protrusion 623.

The organic layer OR1 is in contact with the lower electrode LE1 through the aperture AP1, covers the lower electrode LE1 and overlaps part of the rib 5. The upper electrode UE1 faces the lower electrode LE1 and is provided on the organic layer OR1. Further, the upper electrode UE1 is in contact with a side surface of the lower portion 61. The organic layer OR1 and the upper electrode UE1 are located on the lower side relative to the upper portion 62.

The organic layer OR2 is in contact with the lower electrode LE2 through the aperture AP2, covers the lower electrode LE2 and overlaps part of the rib 5. The upper electrode UE2 faces the lower electrode LE2 and is provided on the organic layer OR2. Further, the upper electrode UE2 is in contact with a side surface of the lower portion 61. The organic layer OR2 and the upper electrode UE2 are located on the lower side relative to the upper portion 62.

The organic layer OR3 is in contact with the lower electrode LE3 through the aperture AP3, covers the lower electrode LE3 and overlaps part of the rib 5. The upper electrode UE3 faces the lower electrode LE3 and is provided on the organic layer OR3. Further, the upper electrode UE3 is in contact with a side surface of the lower portion 61. The organic layer OR3 and the upper electrode UE3 are located on the lower side relative to the upper portion 62.

In the example shown in the figure, subpixels SP1, SP2 and SP3 include cap layers (optical adjustment layers) CP1, CP2 and CP3 for adjusting the optical property of the light emitted from the light emitting layers of the organic layers OR1, OR2 and OR3.

The cap layer CP1 is located in the aperture AP1, is located on the lower side relative to the upper portion 62 and is provided on the upper electrode UE1. The cap layer CP2 is located in the aperture AP2, is located on the lower side relative to the upper portion 62 and is provided on the upper electrode UE2. The cap layer CP3 is located in the aperture AP3, is located on the lower side relative to the upper portion 62 and is provided on the upper electrode UE3.

Sealing layers SE1, SE2 and SE3 are provided in subpixels SP1, SP2 and SP3, respectively.

The sealing layer SE1 is in contact with the cap layer CP1 and the lower and upper portions 61 and 62 of the partition 6 and continuously covers the members of subpixel SP1.

The sealing layer SE2 is in contact with the cap layer CP2 and the lower and upper portions 61 and 62 of the partition 6 and continuously covers the members of subpixel SP2.

The sealing layer SE3 is in contact with the cap layer CP3 and the lower and upper portions 61 and 62 of the partition 6 and continuously covers the members of subpixel SP3.

The sealing layers SE1, SE2 and SE3 are covered with a protective layer 13.

In the example shown in the figure, part of the organic layer OR1, part of the upper electrode UE1 and part of the cap layer CP1 are located between the partition 6 and the sealing layer SE1, are provided on the upper portion 62 and are spaced apart from the portions located on the lower side relative to the upper portion 62.

Part of the organic layer OR2, part of the upper electrode UE2 and part of the cap layer CP2 are located between the partition 6 and the sealing layer SE2, are provided on the upper portion 62 and are spaced apart from the portions located on the lower side relative to the upper portion 62.

Part of the organic layer OR3, part of the upper electrode UE3 and part of the cap layer CP3 are located between the partition 6 and the sealing layer SE3, are provided on the upper portion 62 and are spaced apart from the portions located on the lower side relative to the upper portion 62.

The insulating layer 12 is an organic insulating layer. The rib 5 and the sealing layers SE1, SE2 and SE3 are inorganic insulating layers.

The rib 5 is formed of silicon nitride (SiNx) as an example of inorganic insulating materials. It should be noted that the rib 5 may be formed as, as another inorganic insulating material, a single-layer body of one of silicon oxide (SiOx), silicon oxynitride (SiON) and aluminum oxide ($Al_2O_3$). The rib 5 may be formed as a stacked layer body of a combination consisting of at least two of a silicon nitride layer, a silicon oxide layer, a silicon oxynitride layer and an aluminum oxide layer.

The sealing layers SE1, SE2 and SE3 are formed of, for example, the same inorganic insulating material.

The sealing layers SE1, SE2 and SE3 are formed of silicon nitride (SiNx) as an example of inorganic insulating materials. It should be noted that each of the sealing layers SE1, SE2 and SE3 may be formed as, as another inorganic insulating material, a single-layer body of one of silicon oxide (SiOx), silicon oxynitride (SiON) and aluminum oxide ($Al_2O_3$). Each of the sealing layers SE1, SE2 and SE3 may be formed as a sacked layer body of a combination consisting of at least two of a silicon nitride layer, a silicon oxide layer, a silicon oxynitride layer and an aluminum oxide layer. Thus, the sealing layers SE1, SE2 and SE3 may be formed of the same material as the rib 5.

The lower portion 61 of the partition 6 is formed of a conductive material and is electrically connected to the upper electrodes UE1, UE2 and UE3. The upper portion 62 of the partition 6 may be also formed of a conductive material.

The thickness of the rib 5 is sufficiently less than that of each of the partition 6 and the insulating layer 12. For example, the thickness of the rib 5 is greater than or equal to 200 nm but less than or equal to 400 nm.

The thickness of the lower portion 61 of the partition 6 (the thickness from the upper surface of the rib 5 to the lower surface of the upper portion 62) is greater than that of the rib 5.

The thickness of the sealing layer SE1, the thickness of the sealing layer SE2 and the thickness of the sealing layer SE3 are substantially equal to each other and are, for example, greater than or equal to 1 μm.

Each of the lower electrodes LE1, LE2 and LE3 may be formed of a transparent conductive material such as ITO or may comprise a multilayer structure of a metal material such as silver (Ag) and a transparent conductive material. Each of the upper electrodes UE1, UE2 and UE3 is formed of, for example, a metal material such as an alloy of magnesium and silver (MgAg). Each of the upper electrodes UE1, UE2 and UE3 may be formed of a transparent conductive material such as ITO.

Each of the organic layers OR1, OR2 and OR3 includes a plurality of functional layers such as a hole injection layer, a hole transport layer, an electron blocking layer, a hole blocking layer, an electron transport layer and an electron injection layer. The organic layer OR1 includes a light emitting layer EM1. The organic layer OR2 includes a light emitting layer EM2. The light emitting layer EM2 is formed of a material different from that of the light emitting layer EM1. The organic layer OR3 includes a light emitting layer EM3. The light emitting layer EM3 is formed of a material different from the materials of the light emitting layers EM1 and EM2.

The material of the light emitting layer EM1, the material of the light emitting layer EM2 and the material of the light emitting layer EM3 are materials which emit light in different wavelength ranges.

For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Each of the cap layers CP1, CP2 and CP3 is formed of, for example, a multilayer body of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

The protective layer 13 is formed of a multilayer body of transparent thin films. For example, as the thin films, the multilayer body includes a thin film formed of an inorganic material and a thin film formed of an organic material.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer EM1 of the organic layer OR1 emits light in a blue wavelength range. When a potential difference is formed between the lower electrode LE2 and the upper electrode UE2, the light emitting layer EM2 of the organic layer OR2 emits light in a green wavelength range. When a potential difference is formed between the lower electrode LE3 and the upper electrode UE3, the light emitting layer EM3 of the organic layer OR3 emits light in a red wavelength range.

Figure 6:
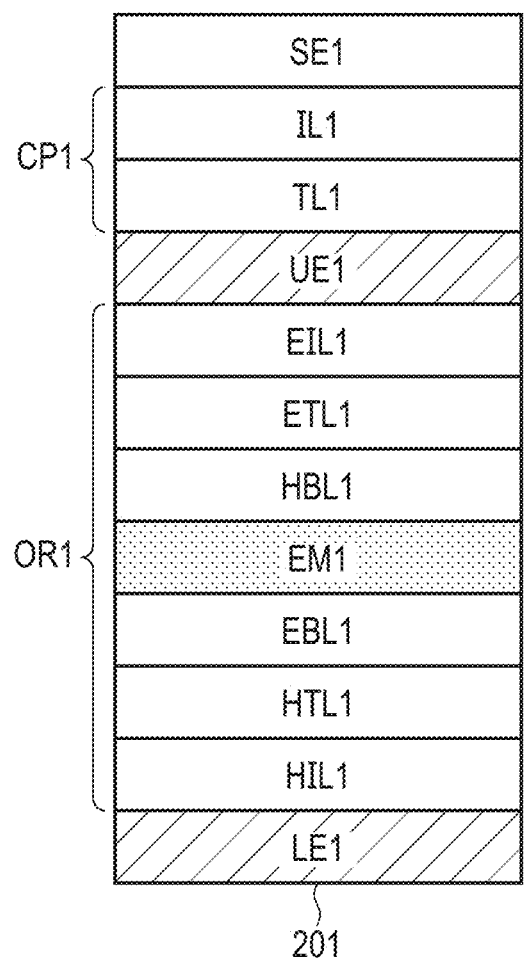
FIG. 6 is a diagram showing an example of the configuration of a display element 201.

FIG. 6 is a diagram showing an example of the configuration of the display element 201. Here, in the example, this specification assumes that the lower electrode corresponds to an anode and the upper electrode corresponds to a cathode.

The display element 201 includes the organic layer OR1 between the lower electrode LE1 and the upper electrode UE1.

In the organic layer OR1, a hole injection layer HIL1, a hole transport layer HTL1, an electron blocking layer EBL1, the light emitting layer EM1, a hole blocking layer HBL1, an electron transport layer ETL1 and an electron injection layer EIL1 are stacked in this order.

It should be noted that the organic layer OR1 may include, in addition to the functional layers described above, other functional layers such as a carrier generation layer as needed, or at least one of the above functional layers may be omitted.

The cap layer CP1 includes a transparent layer TL1 and an inorganic layer IL1. The transparent layer TL1 is provided on the upper electrode UE1. The inorganic layer IL1 is provided on the transparent layer TL1. The sealing layer SE1 is provided on the inorganic layer IL1.

The transparent layer TL1 is, for example, an organic layer formed of an organic material, and is a high refractive layer having a refractive index greater than that of the upper electrode UE1. For example, the inorganic layer IL1 is a transparent thin film formed of lithium fluoride (LiF) or silicon oxide (SiOx) and is a low refractive layer having a refractive index less than that of the transparent layer TL1.

The cap layer CP1 may be a stacked layer body consisting of three or more layers.

Here, an example of the configuration of the display element 201 is explained. A configuration similar to that of the display element 201 can be applied to the other display elements 202 and 203. Alternatively, a configuration different from that of the display element 201 may be applied.

Now, this specification explains an example of the manufacturing method of the display device DSP.

Figure 7:
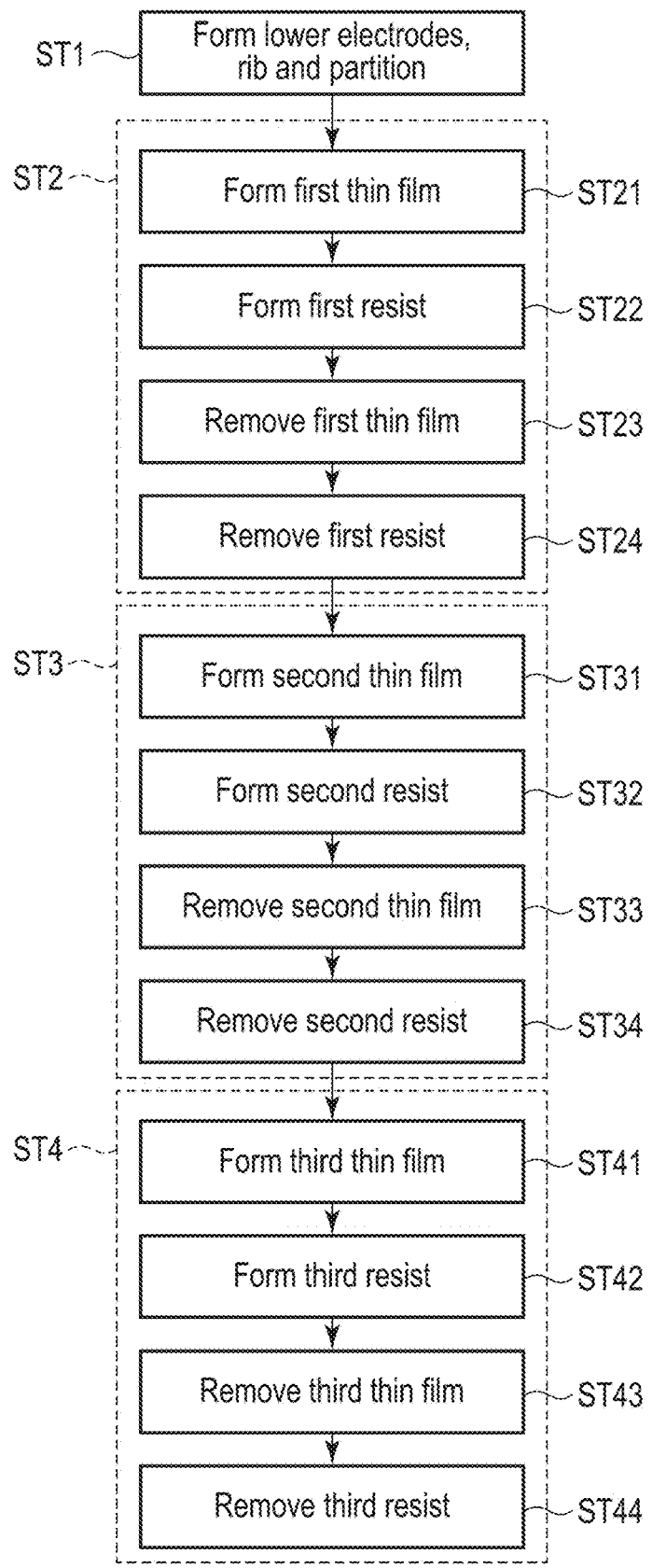
FIG. 7 is a flow diagram for explaining an example of the manufacturing method of the display device DSP.

FIG. 7 is a flow diagram for explaining an example of the manufacturing method of the display device DSP.

The manufacturing method shown here roughly includes the process of preparing a processing substrate SUB comprising subpixels SP1, SP2 and SP3 (step ST1), the process of forming the display element 201 of subpixel SP1 (step ST2), the process of forming the display element 202 of subpixel SP2 (step ST3) and the process of forming the display element 203 of subpixel SP3 (step ST4).

In step ST1, first, the processing substrate SUB is prepared by forming the lower electrode LE1 of subpixel SP1, the lower electrode LE2 of subpixel SP2, the lower electrode LE3 of subpixel SP3, the rib 5 and the partition 6 on the substrate 10. As shown in FIG. 5, the circuit layer 11 and the insulating layer 12 are also formed between the substrate 10 and the lower electrodes LE1, LE2 and LE3.

In step ST2, first, a first thin film 31 including the light emitting layer EM1 is formed over subpixel SP1, subpixel SP2 and subpixel SP3 (step ST21). The first thin film 31 is a stacked layer body consisting of the organic layer OR1, upper electrode UE1, cap layer CP1 and sealing layer SE1 shown in FIG. 5. Subsequently, a first resist 41 patterned into a predetermined shape is formed on the first thin film 31 (step ST22). Subsequently, part of the first thin film 31 is removed by etching using the first resist 41 as a mask (step ST23). At this time, for example, the first thin film 31 provided in subpixel SP2 and subpixel SP3 is removed. Subsequently, the first resist 41 is removed (step ST24). In this way, subpixel SP1 is formed. Subpixel SP1 comprises the display element 201 comprising the first thin film 31 having a predetermined shape.

In step ST3, first, a second thin film 32 including the light emitting layer EM2 is formed over subpixel SP1, subpixel SP2 and subpixel SP3 (step ST31). The second thin film 32 is a stacked layer body consisting of the organic layer OR2, upper electrode UE2, cap layer CP2 and sealing layer SE2 shown in FIG. 5. Subsequently, a second resist 42 patterned into a predetermined shape is formed on the second thin film 32 (step ST32). Subsequently, part of the second thin film 32 is removed by etching using the second resist 42 as a mask (step ST33). At this time, for example, the second thin film 32 provided in subpixel SP1 and subpixel SP3 is removed. Subsequently, the second resist 42 is removed (step ST34). In this way, subpixel SP2 is formed. Subpixel SP2 comprises the display element 202 comprising the second thin film 32 having a predetermined shape.

In step ST4, first, a third thin film 33 including the light emitting layer EM3 is formed over subpixel SP1, subpixel SP2 and subpixel SP3 (step ST41). The third thin film 33 is a stacked layer body consisting of the organic layer OR3, upper electrode UE3, cap layer CP3 and sealing layer SE3 shown in FIG. 5. Subsequently, a third resist 43 patterned into a predetermined shape is formed on the third thin film 33 (step ST42). Subsequently, part of the third thin film 33 is removed by etching using the third resist 43 as a mask (step ST43). At this time, for example, the third thin film 33 provided in subpixel SP1 and subpixel SP2 is removed. Subsequently, the third resist 43 is removed (step ST44). In this way, subpixel SP3 is formed. Subpixel SP3 comprises the display element 203 comprising the third thin film 33 having a predetermined shape.

It should be noted that the detailed illustrations of the second thin film 32, the second resist 42, the third thin film 33 and the third resist 43 are omitted.

Now, this specification explains step ST1 and step ST2 with reference to FIG. 8 to FIG. 12. The section shown in each of FIG. 8 to FIG. 12 corresponds to, for example, the section taken along the A-B line of FIG. 2.

Figure 8:
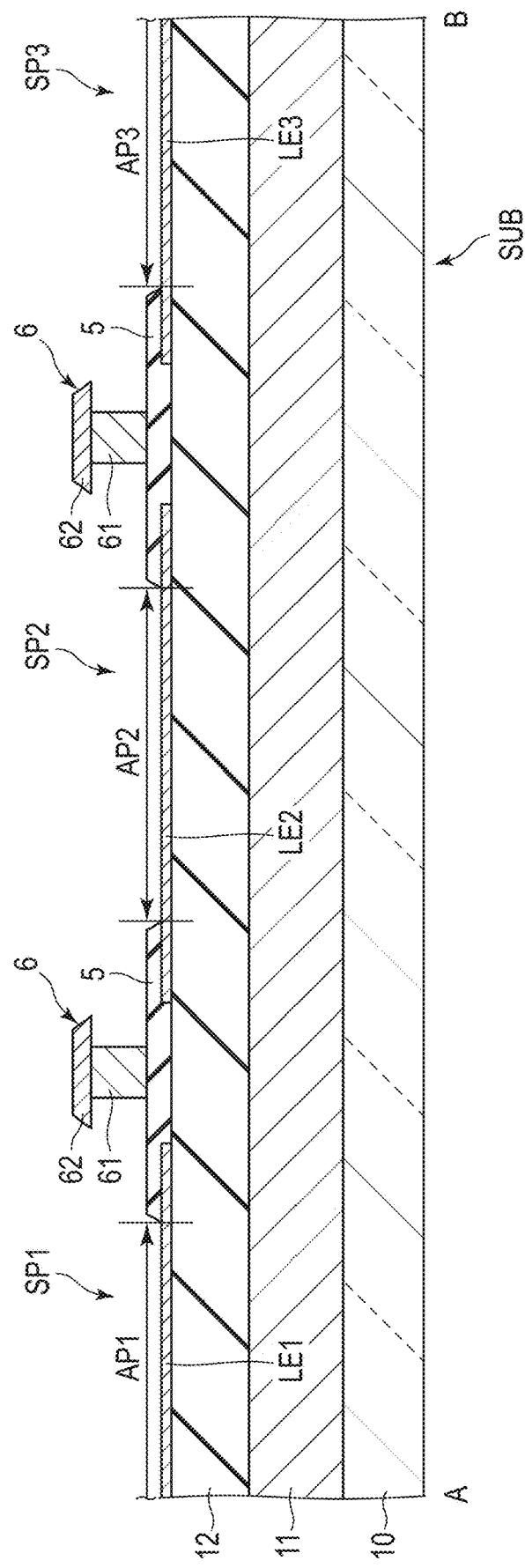
FIG. 8 is a diagram for explaining the manufacturing method of the display device DSP.

First, in step ST1, as shown in FIG. 8, the processing substrate SUB is prepared. The process of preparing the processing substrate SUB includes the process of forming the circuit layer 11 on the substrate 10, the process of forming the insulating layer 12 on the circuit layer 11, the process of forming the lower electrode LE1 of subpixel SP1, the lower electrode LE2 of subpixel SP2 and the lower electrode LE3 of subpixel SP3 on the insulating layer 12, the process of forming the rib 5 comprising the apertures AP1, AP2 and AP3 overlapping the lower electrodes LE1, LE2 and LE3, respectively, and the process of forming the partition 6 including the lower portion 61 provided on the rib 5 and the upper portion 62 provided on the lower portion 61 and protruding from the side surfaces of the lower portion 61.

The rib 5 is formed of, for example, silicon nitride. The process of forming the rib 5 includes the process of forming a silicon nitride layer on the insulating layer 12 and the lower electrodes LE1, LE2 and LE3, the process of forming a resist which is patterned so as to correspond to the apertures AP1, AP2 and AP3, the process of removing the silicon nitride layer by dry etching using the resist as a mask, and the process of removing the resist.

In the process of forming the resist, the resist is patterned such that the edge of each of the apertures AP1, AP2 and AP3 has the shape which is explained with reference to FIG. 3.

In the process of removing the silicon nitride layer, as an etching reactive gas, a fluorine-based gas is introduced into a chamber in which the processing substrate SUB has been carried. As the fluorine-based gas, for example, sulfur hexafluoride ($SF_6$) is applied. It should be noted that, as described above, when all of the angles between the linear portions included in the edge of each of the apertures AP1, AP2 and AP3 are greater than or equal to 90°, for example, tetrafluoromethane ($CF_4$) may be applied as the fluorine-based gas.

This configuration prevents the generation of the residue of silicon nitride inside each of the apertures AP1, AP2 and AP3.

Of the partition 6, at least the lower portion 61 is formed of a conductive material.

The process of forming the apertures AP1, AP2 and AP3 may be performed before the partition 6 is formed or after the partition 6 is formed.

In each of FIG. 9 to FIG. 12, the illustrations of the substrate 10 and the circuit layer 11 lower than the insulating layer 12 are omitted.

Subsequently, in step ST21, as shown FIG. 9, the first thin film 31 is formed over subpixel SP1, subpixel SP2 and subpixel SP3. The process of forming the first thin film 31 includes, on the processing substrate SUB, the process of forming the organic layer OR1 including the light emitting layer EM1, the process of forming the upper electrode UE1 on the organic layer OR1, the process of forming the cap layer CP1 on the upper electrode UE1 and the process of forming the sealing layer SE1 on the cap layer CP1. Thus, in the example shown in the figure, the first thin film 31 includes the organic layer OR1, the upper electrode UE1, the cap layer CP1 and the sealing layer SE1.

The organic layer OR1 is formed on each of the lower electrode LE1, the lower electrode LE2 and the lower electrode LE3 and is also formed on each partition 6. Of the organic layer OR1, the portion formed on each upper portion 62 is spaced apart from the portion formed on each of the lower electrodes. The various functional layers and the light emitting layer EM1 of the organic layer OR1 are formed by a vapor deposition method.

The upper electrode UE1 is formed on the organic layer OR1 immediately above each of the lower electrodes LE1, LE2 and LE3, covers the rib 5 and is in contact with the lower portion 61 of each partition 6. The upper electrode UE1 is also formed on the organic layer OR1 immediately above each upper portion 62. Of the upper electrode UE1, the portion which is formed immediately above each upper portion 62 is spaced apart from the portion which is formed immediately above each of the lower electrodes. The upper electrode UE1 is formed by a vapor deposition method.

The cap layer CP1 is formed on the upper electrode UE1 immediately above each of the lower electrodes LE1, LE2 and LE3, and is also formed on the upper electrode UE1 immediately above each upper portion 62. Of the cap layer CP1, the portion which is formed immediately above each upper portion 62 is spaced apart from the portion which is formed immediately above each of the lower electrodes. The transparent layer and inorganic layer included in the cap layer CP1 are formed by a vapor deposition method.

The sealing layer SE1 is formed so as to cover the cap layer CP1 and the partition 6. In other words, the sealing layer SE1 is formed on the cap layer CP1 immediately above each of the lower electrodes LE1, LE2 and LE3, and is also formed on the cap layer CP1 immediately above each upper portion 62. In the sealing layer SE1, the portion which is formed immediately above each upper portion 62 is continuous with the portion which is formed immediately above each of the lower electrodes. The sealing layer SE1 is formed by a CVD method. The upper electrode UE1 is interposed between the rib 5 and the sealing layer SE1. The sealing layer SE1 is spaced apart from the rib 5.

Subsequently, in step ST22, as shown in FIG. 10, the patterned first resist 41 is formed on the sealing layer SE1. The first resist 41 covers the first thin film 31 of subpixel SP1, and the first thin film 31 is exposed from the first resist 41 in subpixels SP2 and SP3. Thus, the first resist 41 overlaps the sealing layer SE1 located immediately above the lower electrode LE1. The first resist 41 extends from subpixel SP1 to the upper side of the partition 6. On the partition 6 between subpixel SP1 and subpixel SP2, the first resist 41 is provided on the subpixel SP1 side (the left side of the figure), and the sealing layer SE1 is exposed from the first resist 41 on the subpixel SP2 side (the right side of the figure). The sealing layer SE1 is exposed from the first resist 41 in subpixel SP2 and subpixel SP3.

Figure 11:
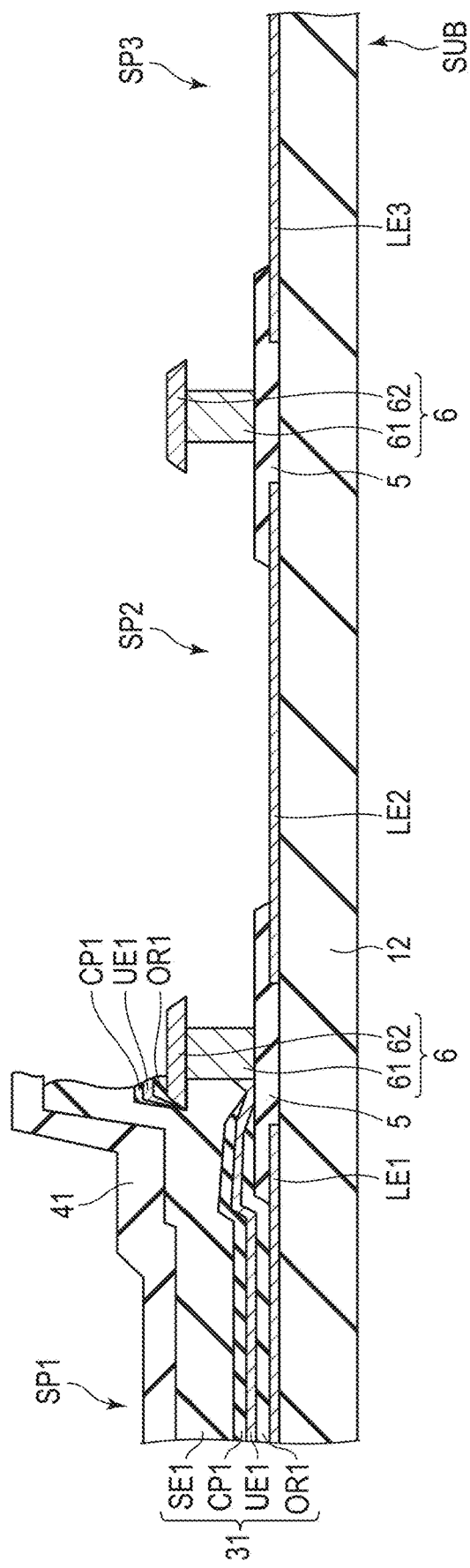
FIG. 11 is a diagram for explaining the manufacturing method of the display device DSP.

Subsequently, in step ST23, as shown in FIG. 11, etching is applied using the first resist 41 as a mask. By this process, the first thin film 31 exposed from the first resist 41 in subpixels SP2 and SP3 is removed, and the first thin film 31 remains in subpixel SP1.

The process of removing the first thin film 31 is, for example, as follows.

First, dry etching is performed using the first resist 41 as a mask to remove the sealing layer SE1 exposed from the first resist 41.

Subsequently, wet etching is performed using the first resist 41 as a mask to remove the inorganic layer of the cap layer CP1 exposed from the sealing layer SE1.

Subsequently, dry etching is performed using the first resist 41 as a mask to remove the transparent layer of the cap layer CP1 exposed from the inorganic layer.

Subsequently, wet etching is performed using the first resist 41 as a mask to remove the upper electrode UE1 exposed from the transparent layer.

Subsequently, dry etching is performed using the first resist 41 as a mask to remove the organic layer OR1 exposed from the upper electrode UE1.

In this way, the lower electrode LE2 is exposed in subpixel SP2, and the rib 5 surrounding the lower electrode LE2 is exposed. In subpixel SP3, the lower electrode LE3 is exposed, and the rib 5 surrounding the lower electrode LE3 is exposed. On the partition 6 between subpixel SP1 and subpixel SP2, the subpixel SP2 side is exposed. Further, the partition 6 between subpixel SP2 and subpixel SP3 is exposed.

Subsequently, in step ST24, as shown in FIG. 12, the first resist 41 is removed. Thus, the sealing layer SE1 of subpixel SP1 is exposed. Through these steps ST21 to ST24, the display element 201 is formed in subpixel SP1. The display element 201 consists of the lower electrode LE1, the organic layer OR1 including the light emitting layer EM1, the upper electrode UE1 and the cap layer CP1. The display element 201 is covered with the sealing layer SE1.

A stacked layer body of the organic layer OR1 including the light emitting layer EM1, the upper electrode UE1, the cap layer CP1 and the sealing layer SE1 is formed on the partition 6 between subpixel SP1 and subpixel SP2. Of the partition 6, the portion on the subpixel SP1 side is covered with the sealing layer SE1. It should be noted that the stacked layer body on the partition 6 shown in FIG. 12 is completely removed in some cases.

Steps ST31 to ST34 shown in FIG. 7 are similar to steps ST21 to ST24 described above. Through these steps ST31 to ST34, the display element 202 is formed in subpixel SP2 shown in FIG. 5. The display element 202 consists of the lower electrode LE2, the organic layer OR2 including the light emitting layer EM2, the upper electrode UE2 and the cap layer CP2. The display element 202 is covered with the sealing layer SE2.

Steps ST41 to ST44 shown in FIG. 7 are similar to steps ST21 to ST24 described above. Through these steps ST41 to ST44, the display element 203 is formed in subpixel SP3 shown in FIG. 5. The display element 203 consists of the lower electrode LE3, the organic layer OR3 including the light emitting layer EM3, the upper electrode UE3 and the cap layer CP3. The display element 203 is covered with the sealing layer SE3.

As explained above, when the rib 5 comprising the apertures AP1, AP2 and AP3 is formed, the generation of the residue of silicon nitride is prevented. For example, when a residue is generated near the edge of the aperture AP1, a crack may be generated in the organic layer OR1 by the effect of the residue, and a short-circuit between the lower electrode LE1 and the upper electrode UE1 may be caused.

According to the present embodiment, as the generation of the residue of silicon nitride is prevented, a short-circuit between the lower electrode LE1 and the upper electrode UE1 is prevented. Moreover, this configuration prevents a pixel defect in which the display element 201 does not emit light because of a short-circuit between the lower electrode LE1 and the upper electrode UE1. In this way, the reduction in reliability can be prevented.

Further, the crack of the upper electrode UE1 or the cap layer CP1 because of the residue of silicon nitride is prevented. Thus, it is possible to avoid the damage to the lower electrode LE2 of subpixel SP2, the lower electrode LE3 of subpixel SP3 and the rib 5 in the etching process of removing each of the sealing layer SE1, the upper electrode UE1 and the organic layer OR1.

Now, a modification example is explained.

Figure 13:
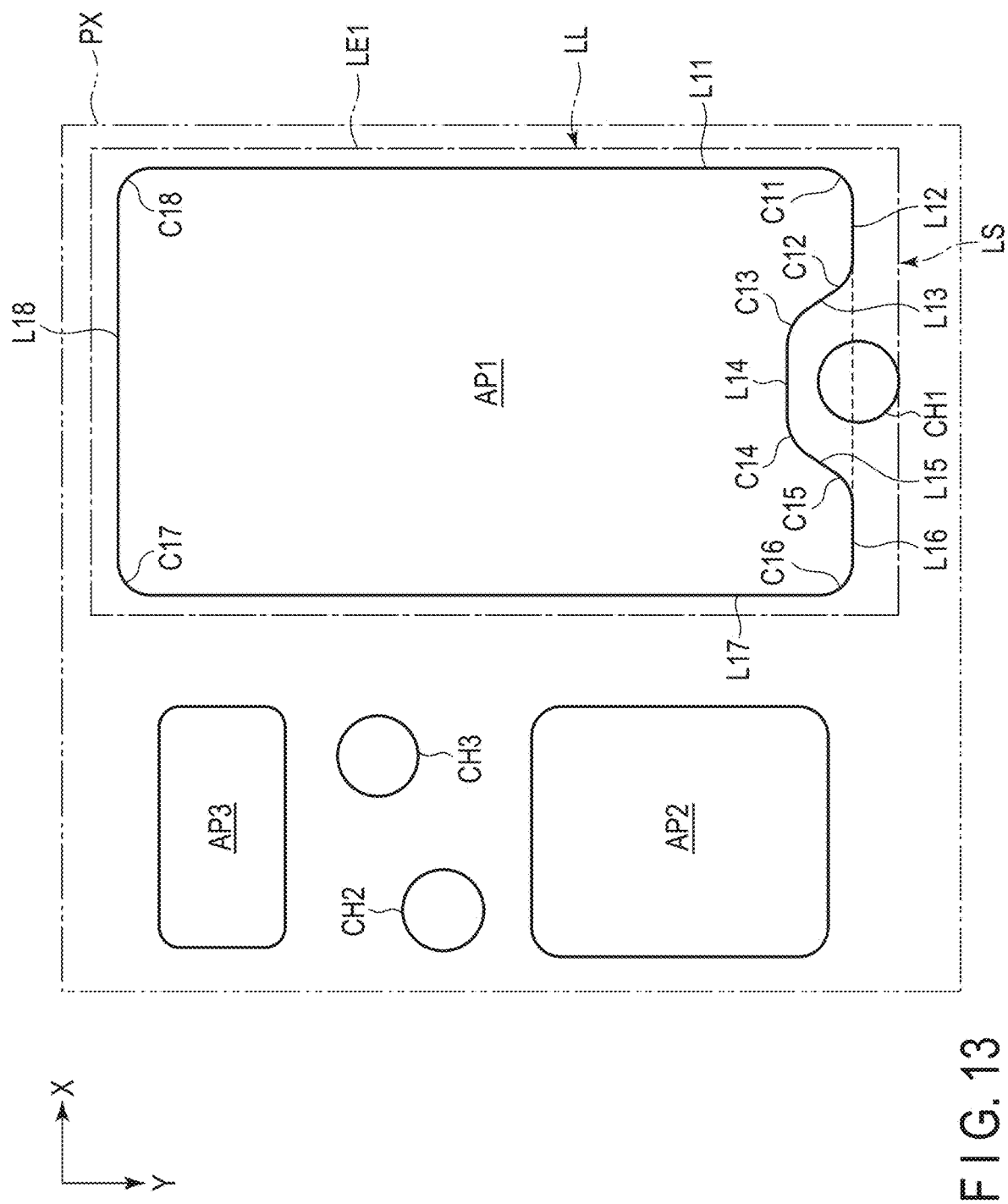
FIG. 13 is a plan view for explaining another example of the shape of each of the apertures AP1, AP2 and AP3 of the rib 5.

FIG. 13 is a plan view for explaining another example of the shape of each of the apertures AP1, AP2 and AP3 of the rib 5.

The edge of the aperture AP1 comprises linear portions L11 to L18 and curved portions C11 to C18.

The linear portions L11 and L17 are parallel to each other, extend in the second direction Y and are substantially parallel to the long side LL of the lower electrode LE1. The linear portions L12, L14, L16 and L18 are parallel to each other, extend in the first direction X and are substantially parallel to the short side LS of the lower electrode LE1. In particular, the linear portions L12 and L16 are located on the same straight line. The contact hole CH1 is located between the linear portion L12 and the linear portion L16, and is located on the same straight line as the linear portions L12 and L16. The linear portion L14 is located between the contact hole CH1 and the linear portion L18 in the second direction Y. The linear portions L13 and L15 extend in oblique directions different from the first direction X and the second direction Y.

Each of the curved portions C11 to C18 is formed in substantially an arcuate shape. The curved portion C11 is connected to the linear portions L11 and L12. The curved portion C12 is connected to the linear portions L12 and L13. The curved portion C13 is connected to the linear portions L13 and L14. The curved portion C14 is connected to the linear portions L14 and L15. The curved portion C15 is connected to the linear portions L15 and L16. The curved portion C16 is connected to the linear portions L16 and L17. The curved portion C17 is connected to the linear portions L17 and L18. The curved portion C18 is connected to the linear portions L18 and L11.

In the example shown in FIG. 13, in a manner similar to that of the example shown in FIG. 3, the angle between two linear portions which are adjacent to each other across an intervening curved portion is greater than or equal to 90°.

As the shapes of the apertures AP2 and AP3 are similar to those of the example shown in FIG. 3, explanation thereof is omitted.

In the examples shown in FIG. 3 and FIG. 13, the linear portion L11 corresponds to a first linear portion. The linear portion L12 corresponds to a second linear portion. The linear portion L16 corresponds to a third linear portion.

In this example, effects similar to those of the above description can be obtained.

Now, a comparative example is explained.

Figure 14:
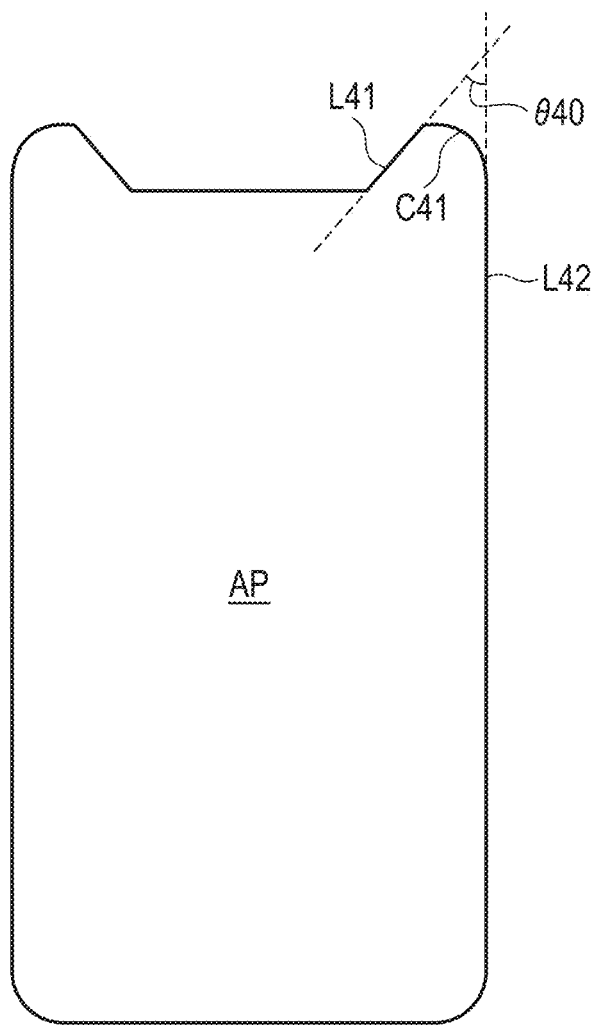
FIG. 14 is a plan view for explaining a comparative example of the shape of the aperture AP of the rib 5.

FIG. 14 is a plan view for explaining a comparative example of the shape of the aperture AP of the rib 5.

The edge of the aperture AP includes a linear portion L41, a linear portion L42 and a curved portion C41. The curved portion C41 is connected to the linear portion L41 and the linear portion L42. In the comparative example, angle 640 between the linear portion L41 and the linear portion L42 is an acute angle less than 90°.

The process of forming the aperture AP including this edge is explained.

First, a silicon nitride layer is formed. A resist is formed on the silicon nitride layer. Subsequently, the silicon nitride layer is removed by dry etching using the resist as a mask.

Here, an experiment was conducted to confirm the presence or absence of the residue of silicon nitride by performing dry etching in which tetrafluoromethane ($CF_4$) was applied as the etching reactive gas. Dry etching was performed on the same condition for a plurality of processing substrates. It was confirmed that the residue of silicon nitride was generated inside the curved portion C41 in some processing substrates.

Further, an experiment was conducted to confirm the presence or absence of the residue of silicon nitride by performing dry etching in which sulfur hexafluoride ($SF_6$) was applied as the etching reactive gas. Dry etching was performed on the same condition for a plurality of processing substrates. It was confirmed that the residue of silicon nitride was not generated in most processing substrates.

As explained above, the present embodiment can provide a display device which can prevent the reduction in reliability and realize an improved manufacturing yield.

All of the display devices that can be implemented by a person of ordinary skill in the art through arbitrary design changes to the display device described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A display device comprising:
   a substrate;
   a lower electrode provided above the substrate;
   a rib formed of an inorganic insulating material and comprising an aperture overlapping the lower electrode;
   a partition comprising a lower portion provided on the rib and formed of a conductive material, and an upper portion provided on the lower portion and protruding from a side surface of the lower portion;
   an organic layer provided on the lower electrode in the aperture;
   an upper electrode provided on the organic layer;
   a cap layer provided on the upper electrode; and
   a sealing layer which covers the cap layer and is in contact with the lower portion of the partition, wherein
   an edge of the aperture includes a first linear portion, a second linear portion and a curved portion connected to the first linear portion and the second linear portion, and
   an angle between the first linear portion and the second linear portion is greater than or equal to 90°.

2. The display device of claim 1, wherein
   a length of each of the first linear portion and the second linear portion is greater than or equal to a radius of curvature of the curved portion.

3. The display device of claim 1, wherein
   the edge of the aperture further includes a third linear portion spaced apart from the second linear portion,
   the second linear portion and the third linear portion are parallel to each other and are located on a same straight line, and
   a contact hole for electrically connecting the lower electrode and a pixel circuit is located between the second linear portion and the third linear portion.

4. The display device of claim 3, wherein
   the second linear portion and the third linear portion extend along a long side of the lower electrode.

5. The display device of claim 3, wherein
   the second linear portion and the third linear portion extend along a short side of the lower electrode.

6. The display device of claim 1, wherein
   the rib is formed of at least one of silicon nitride, silicon oxide, silicon oxynitride and aluminum oxide.

7. The display device of claim 1, wherein
   part of the organic layer, part of the upper electrode and part of the cap layer are provided on the upper portion of the partition, and are spaced apart from a portion which is located on a lower side relative to the upper portion and includes the organic layer, the upper electrode and the cap layer.

8. The display device of claim 1, wherein
   the sealing layer is formed of at least one of silicon nitride, silicon oxide, silicon oxynitride and aluminum oxide.

9. The display device of claim 1, wherein
   the upper electrode is formed of an alloy of magnesium and silver.

10. The display device of claim 1, wherein
    the cap layer comprises a transparent layer provided on the upper electrode, and an inorganic layer provided on the transparent layer, and
    the inorganic layer is formed of lithium fluoride or silicon oxide.

* * * * *